United States Patent [19]

Campbell, Jr.

[11] 4,394,748

[45] Jul. 19, 1983

[54] ROM COLUMN SELECT CIRCUIT AND SENSE AMPLIFIER

[75] Inventor: Jules D. Campbell, Jr., Austin, Tex.

[73] Assignee: Motorola, Inc., Schaumburg, Ill.

[21] Appl. No.: 293,772

[22] Filed: Aug. 18, 1981

[51] Int. Cl.³ .................... G11C 7/00; G11C 17/00
[52] U.S. Cl. .................................. 365/104; 365/189; 365/230
[58] Field of Search ............... 365/104, 189, 230, 231

[56] References Cited

U.S. PATENT DOCUMENTS 3,704,454 11/1972 McCoy et al. .................. 365/104
4,274,147 6/1981 Padgett et al. .................. 365/104

FOREIGN PATENT DOCUMENTS 29716 3/1981 European Pat. Off. ......... 365/104
56-51093 8/1981 Japan .............................. 365/104

Primary Examiner—George G. Stellar
Attorney, Agent, or Firm—Anthony J. Sarli, Jr.; Jeffrey Van Myers; Robert L. King

[57] ABSTRACT

A column select circuit and a sense amplifier for use in a ROM utilizing a dynamic or static row and column select scheme is provided. The column select circuit comprises a voltage divider utilizing MOS transistors which have the gate dimensions thereof sized in proportion to the gate dimensions of the transistors in the ROM. The column select circuit provides a biasing voltage which controls a column select transistor and which tracks variations in process and supply voltage thereby providing precise biasing of the column select transistor and decreasing the access time of the ROM. The sense amplifier comprises a source follower and an output buffer stage.

12 Claims, 2 Drawing Figures

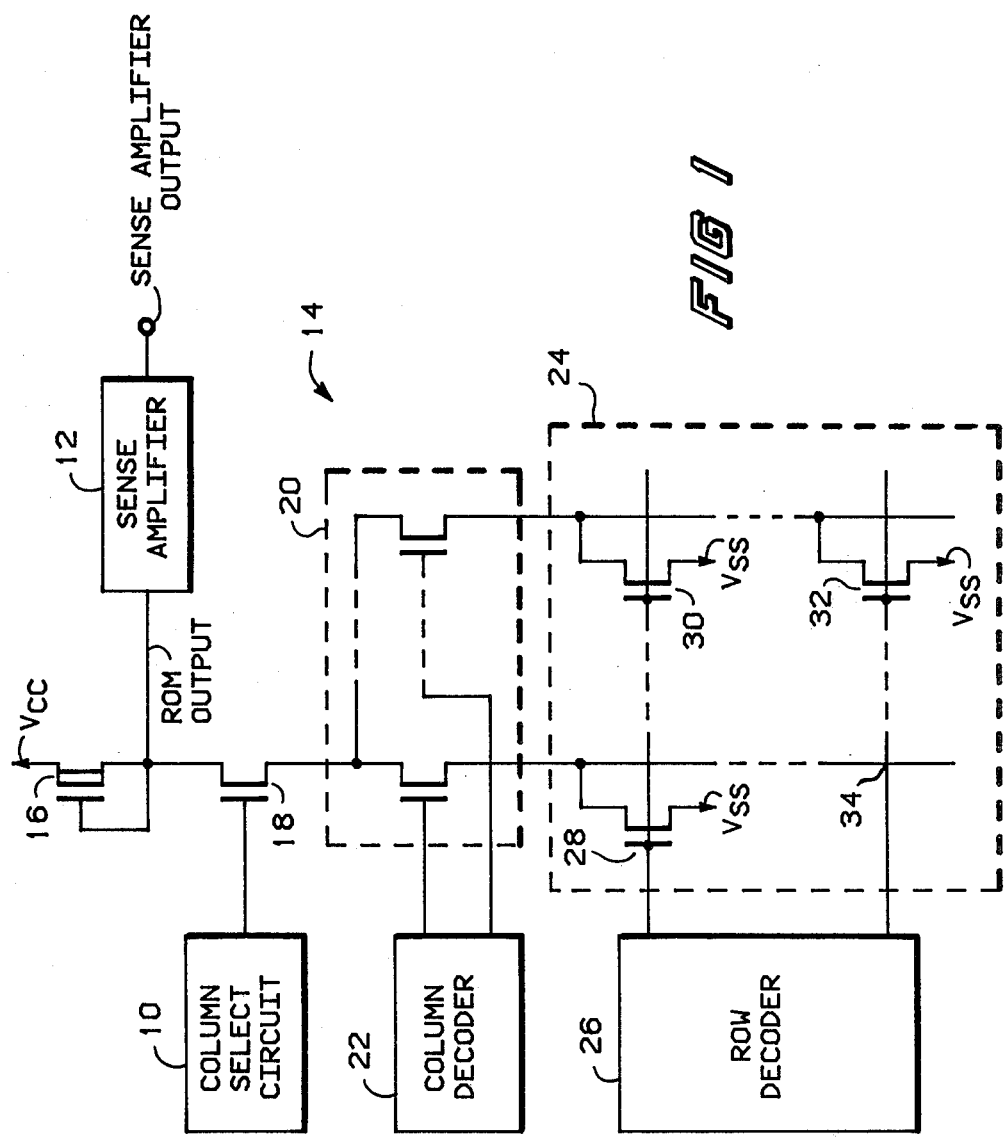

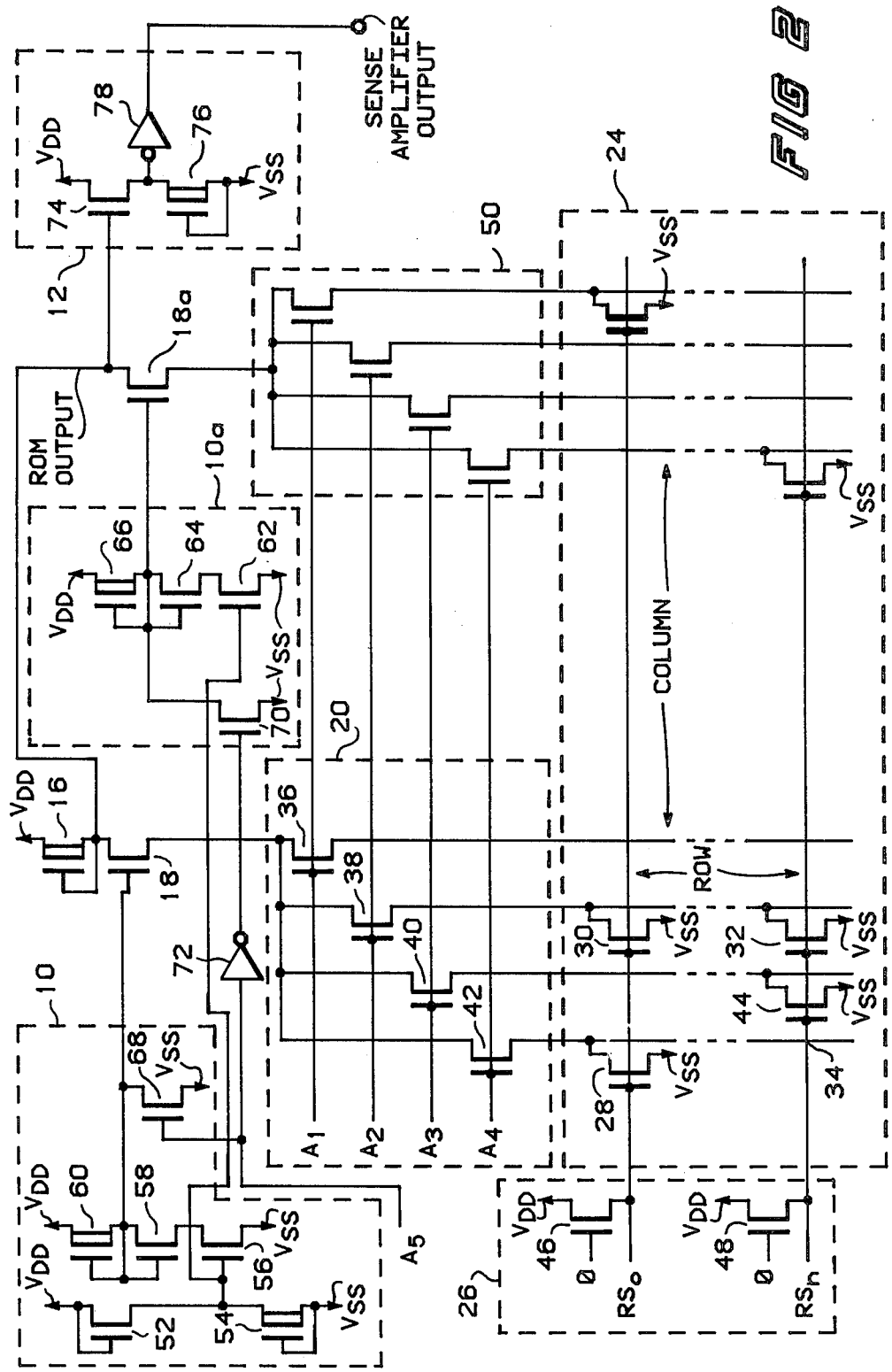

ROM COLUMN SELECT CIRCUIT AND SENSE AMPLIFIER

BACKGROUND OF THE INVENTION

1. Field of the Invention

This invention relates generally to read only memory circuits and more particularly to column select circuits and sense amplifiers for use in a read only memory.

2. Description of the Prior Art

Typically, read only memory circuits (ROMs) utilize dynamic or static row and column select schemes. For example, one type of dynamic row select scheme precharges all rows of a ROM array as a result of a precharge pulse signal. A predetermined column is then selectively coupled to an individual sense amplifier in response to a column decoder which is controlled by address lines of the ROM. Logic "low" and "high" levels are produced by the presence or absence of a program transistor at the intersection of a row and column in the ROM. At the end of the precharge pulse, a load will charge the column in the absence of a program transistor. A disadvantage of the prior art has been the inability to charge the capacitance associated with the column in a short period of time, thereby limiting the access time. A prior improvement in the speed of the circuit has been achieved by decoupling the column capacitance. However, a limitation of this improvement has been the necessity to sink all the current from the column load in order to produce a "low" logic level. Circuits which decouple the column capacitance consume more power and the decoupling is susceptible to process and supply voltage variations.

Usually, the ROM output voltage is not within the range associated with a logical "high" or "low" level for the remainder of the circuit. Therefore, a sense amplifier is connected to the ROM output to translate the output to a valid logical "high" or "low". Sense amplifiers commonly have size disadvantages and increase the access time.

SUMMARY OF THE INVENTION

It is an object of the present invention to provide an improved read only memory column select circuit and sense amplifier.

Another object of this invention is to provide an improved column select circuit for use in a read only memory and which provides a biasing voltage that tracks process and supply voltage variations and compensates therefor.

Yet another object of the invention is to provide an improved column select circuit and sense amplifier for use in a read only memory which generally has improved access time, reduced power requirements and reduced circuit area than those of the prior art.

In carrying out the above and other objects and advantages of the present invention, there is provided, in one form, a read only memory (ROM). The ROM contains a multiple bit data word wherein each bit has multiple rows which are precharged before selection of a single row by the row select circuitry and multiple columns of which one is selected by column select circuitry. Logic levels are produced by the presence or absence of an MOS program transistor at the intersection of a row and column in the ROM. The ROM also comprises a column select MOS transistor that is biased by a voltage divider comprised of MOS transistors. The voltage divider provides a voltage greater than the voltage developed on the source of the column select transistor by approximately the threshold voltage of the column select MOS transistor. The MOS transistors of the voltage divider have the gates thereof size ratioed with the MOS transistors in the columns and rows of the ROM to achieve biasing at the gate of the column select MOS transistor which tracks process and supply voltage variations. A sense amplifier comprised of two MOS transistors is connected in a source follower configuration to the ROM output for translating the output voltage, and a buffer output stage is connected to the source follower for additional gain. The above and other objects, features and advantages of the present invention will be more clearly understood from the following detailed description taken in conjunction with the accompanying drawings.

BRIEF DESCRIPTION OF THE DRAWINGS

FIG. 1 is a block diagram of the schematic diagram shown in FIG. 2; and

FIG. 2 is a schematic diagram illustrating one preferred embodiment of the invention.

DESCRIPTION OF THE PREFERRED EMBODIMENT

Shown in FIG. 1 is a block diagram of a ROM column select circuit 10 and a sense amplifier 12 for use in a read only memory 14. Read only memory 14 is coupled to a column load transistor 16 via a primary column select transistor 18. One of a plurality of secondary column select transistors 20 is enabled by a column decoder 22 to couple primary column select transistor 18 to one of a plurality of program transistors 24 which is enabled by a row decoder 26. ROM 14 is programmed by inserting transistors, such as transistors 28, 30 and 32, at the intersection of predetermined rows and columns and inserting no transistors at other nodal intersections such as node 34.

ROM 14 uses a dynamic row select scheme comprising row decoder 26 which is controlled by logic (not shown) to precharge all the rows. The row select scheme then discharges all columns having at least one program transistor to a supply voltage $V_{SS}$. A first plurality of secondary column select transistors 20 each have a gate, or control electrode, connected to a respective output of column decoder 22 and are enabled by control logic (not shown) for selectively coupling one of the columns to primary column select transistor 18. All rows except the selected row are then discharged by row decoder 26 to the supply voltage, $V_{SS}$. If a program transistor, such as transistor 28, is present at the intersection of the chosen column and row, the column will remain discharged to near supply voltage $V_{SS}$ and a logic "low" is presented to a primary column select transistor, such as transistor 18. If no transistor is present at the intersection of the chosen column and row, column load transistor 16 will charge the selected column toward a supply voltage $V_{DD}$ and a logic "high" is presented to a primary column select transistor, such as transistor 18.

Shown in FIG. 2 is a schematic diagram of ROM column select circuit 10 and sense amplifier 12. Column load transistor 16 is only one of many devices which may be used to provide a column load. In a preferred form, a first current electrode, or drain, of column load transistor 16 is connected to supply voltage $V_{DD}$, and a second current electrode and a control electrode (i.e.

the source and gate, respectively) are connected to both a ROM output and the drains of primary column select transistors 18 and 18a. Column select transistor 18 has the source thereof connected to the drains of secondary column select transistors 36, 38, 40 and 42. The gates of secondary column select transistors 36, 38, 40 and 42 are connected to control lines A1, A2, A3 and A4, respectively. Each control line is connected to column decode logic (not shown) for controlling which one of secondary column select transistors 36, 38, 40 or 42 is enabled. Program transistors 28, 30, 32 and 44 are located at predetermined intersections of rows and columns of ROM 14 in accordance with a predetermined program. Row decoder 26 is comprised of row precharge transistors, such as transistors 46 and 48, which have the drains thereof connected to supply voltage $V_{DD}$ and the sources thereof connected to a respective row. The gates of transistors 46 and 48 are connected to a precharge pulse ∅ which is generated by control logic (not shown). Both the source of transistor 46 and the gates of program transistors 28 and 30 and both the source of transistor 48 and the gates of program transistors 32 and 44 are respectively connected to row select signals, $RS_0$ and $RS_n$. Additional rows having program transistors at predetermined column and row intersections may be added, and an additional row precharge transistor, such as transistor 46, and row select signal are needed for each row added to ROM 14.

An additional primary column select transistor 18a has the drain thereof connected to the ROM output terminal and the source thereof connected to a second plurality of secondary column select transistors 50 comprising four additional secondary column select transistors which are connected in a manner analagous to transistors 36, 38, 40 and 42. Control lines A1, A2, A3 and A4 are used to respectively control the second plurality of secondary column select transistors 50 in which all the drains thereof are connected to the source of transistor 18a. The columns connected to the sources of the second plurality of secondary column select transistors 50 are intersected by the same rows which intersect the columns connected to column select transistors 36, 38, 40 and 42. There has thus been provided two primary columns of ROM 14 which may be separately switched to the ROM output by primary column select transistors 18 and 18a. Additional levels of decoding may be added to expand the number of rows and columns in ROM 14 so that the decoding scheme shown in FIG. 2 is for illustrative purposes only and is but one of many schemes which may be used in conjunction with column select circuit 10 and sense amplifier 12. Although in a preferred form of the invention all of the transistors described are MOS transistors, the invention is not restricted to the use of MOS transistors.

Column select circuit 10 is comprised of a transistor 52 having the drain and gate thereof connected to supply voltage $V_{DD}$. The source of transistor 52 is connected to the drain of a transistor 54 having the gate and source thereof connected to supply voltage $V_{SS}$. Transistors 52 and 54 form a source follower which has an output connected to the gate of a transistor 56 at the nodal connection of the source of transistor 52 and the drain of transistor 54. The source of transistor 56 is connected to supply voltage $V_{SS}$ and the drain is connected to the source of a transistor 58 having both the gate and drain thereof connected to the gate of primary column select transistor 18. A transistor 60 has the drain thereof connected to supply voltage $V_{DD}$ and both the gate and source thereof also connected to the gate of primary column select transistor 18.

A second column select circuit 10a comprised of transistors 62, 64 and 66 is used to provide biasing for primary column select transistor 18a. The gate of transistor 62 is connected to the output of the source follower formed by transistors 52 and 54 at the gate of transistor 56, and the source of transistor 62 is connected to supply voltage $V_{SS}$. The gates of transistors 64 and 66, the source of transistor 66 and the drain of transistor 64 are all connected together and to the gate of primary column select transistor 18a. The drain of transistor 66 is connected to supply voltage $V_{DD}$. In a preferred form, transistors 16, 54, 60 and 66 are depletion mode devices which do not have a threshold voltage drop $V_T$.

In addition, first and second column select circuits 10 and 10a comprise enabling transistors 68 and 70, respectively. A control signal A5 is connected to both the gate of transistor 68 and the input of an inverter 72 which has an output connected to the gate of a transistor 70. Transistors 68 and 70 have the sources thereof connected to supply voltage $V_{SS}$ and the drains thereof are connected to the gates of primary column select transistors 18 and 18a, respectively.

Sense amplifier 12 is comprised of transistors 74 and 76. The gate of transistor 74 is connected to the output of ROM 14 and the drain thereof is connected to supply voltage $V_{DD}$. The source and gate of transistor 76 are both connected to supply voltage $V_{SS}$ and the drain thereof is connected to the source of transistor 74. In the preferred form, transistor 76 is a depletion mode device. An output buffer amplifier comprising an inverter 78 has an input connected to the source of transistor 74 and an output which is the sense amplifier output.

In operation, the rows of ROM 14 are precharged by the application of precharge pulse ∅ to the gates of row precharge transistors, such as transistors 46 and 48. After the precharge pulse, all but one of the rows is discharged by row select decoding in the control logic (not shown). The control logic does not generate a signal for the one row which is not discharged. A program transistor, such as transistor 28, is enabled by the row which was not discharged and is coupled to the ROM output by both an enabled secondary column select transistor, such as transistor 36, and by an enabled primary column select transistor, such as transistor 18. Control signal A5 enables either transistor 68 or 70 which disables transistor 18 or 18a, respectively, thereby disabling either column select circuit 10 or 10a, respectively. The purpose of column select circuits 10 and 10a is to provide a voltage reference to the gate of either primary column select transistors 18 or 18a which can quickly decouple the capacitance of a column in ROM 14 having no enabled program transistor from load transistor 16 and the input of sense amplifier 12. The column capacitance exists primarily at the source of an enabled secondary column select transistor, such as transistor 36. Once a selected column has been decoupled, the access time is improved since column load transistor 16 need only charge the capacitance associated with its source thereof, the capacitance of the drains of primary column select transistors 18 and 18a, and the input capacitance of sense amplifier 12. To accomplish rapid decoupling, the voltage on the gate of transistor 18 must vary with process and supply voltage variations.

For example, if the supply voltage is at a lower value of its normal operating range and/or the enhancement transistors have higher thresholds and/or lower conduction factors than usual, the voltage to which the rows are precharged will be lower than usual. After the row precharge pulse, a selected program transistor, such as transistor 28, would require a higher drain-to-source voltage to sink the column load current due to its lower gate voltage and/or lower conduction factor. The increase in the drain-to-source voltage of a selected secondary column select transistor is not as large as that of the selected program transistor because of the geometric ratio, which is the width-to-length ratio (W/L) of the gate of the secondary column select transistor, and because its gate voltage is $V_{DD}$. As a result, the voltage from the drain of the selected secondary column select transistor to $V_{SS}$ is essentially the same as the drain-to-source voltage of the selected program transistor. Since the voltage at the junction of primary column select transistor 18 or 18a and an enabled secondary column select transistor, such as transistor 36, is higher than usual, the gate voltage of primary column select transistor 18 or 18a must be at a higher value than usual in order to sink all the current supplied by the column load. The higher gate voltage of primary column select transistor 18 or 18a is required to maintain its drain-to-source voltage at a low value thereby making the ROM output voltage with respect to $V_{SS}$ a small value above the drain-to-source voltage of the selected program transistor.

Conversely, if the supply voltage is at a higher value of its normal operating range and/or the enhancement transistors have lower thresholds and/or higher conduction factors than usual, the voltage to which the rows are precharged will be higher than usual. After the row precharge pulse, a selected program transistor such as transistor 28, would have a lower drain-to-source voltage due to its higher gate voltage and/or higher conduction factor. The decrease in the drain-to-source voltage of the secondary column select transistor only aids in making its drain voltage closer to the drain voltage of the program transistor with respect to $V_{SS}$. As a result, the voltage from the drain of the secondary column select transistor to $V_{SS}$ is essentially the same as the drain-to-source voltage of the selected program transistor. Since the voltage at the junction of a primary column select transistor, such as transistor 18, and a secondary column select transistor, such as transistor 36, is lower than usual and it is desirable to quickly decouple the column capacitance from the load, the gate voltage of the primary column select transistor must be at a lower value than usual while maintaining a low drain-to-source voltage on the primary column select transistor.

To accomplish this voltage variation, the biasing for transistors 18 and 18a is generated so that it will track and follow supply and process variations. This is done by sizing the gate dimensions of the transistors in column select circuit 10 and 10a in proportion to the transistors of ROM 14. The conductivity of a transistor is directly proportional to its geometric ratio or width-to-length ratio (W/L) of the gate thereof. Theoretically, two transistors of identical type and gate dimensions would have equal drain-to-source currents if biased by equal gate-to-source voltages and equal drain-to-source voltages.

In applying these principles, the gate width-to-length ratio of transistor 52 is made approximately equal to the gate width-to-length ratio of row precharge transistors such as transistors 46 and 48 in row decoder 26. Transistor 52 performs as a source follower into transistor 54. The source follower provides a voltage reference at the source of transistor 52 which is equivalent to the precharge voltage put on the rows of ROM 14 by row precharge transistors, such as transistors 46 and 48, in response to precharge pulse $\emptyset$. The gate width-to-length ratio of transistor 54 is chosen so that its drain-to-source current is sufficient to bias transistor 52 at approximately the threshold voltage.

A reference voltage which is related to supply voltage $V_{DD}$ is developed by transistors 52 and 54 and is connected to the gates of transistors 56 and 62. Furthermore, both the gate voltage of transistors 56 and 62 and the geometric ratios, W/L, are made equivalent to the gate voltage and geometric ratio of a selected program transistor, such as either transistor 28, 30, 32 or 44. Therefore, the conductivity of either transistor 56 or 62 and either 28, 30, 32 or 44 will be equivalent during a precharge. Furthermore, the geometric ratios of transistors 60 and 66 are each matched to the geometric ratio of column load transistor 16 to produce equivalent drain-to-source currents through each transistor. As a result, the drain-to-source voltage of either enabled transistor 56 or 62 is equivalent to the drain-to-source voltage of a selected program transistor, such as transistors 28, 30, 32 or 44.

The current from $V_{DD}$ to $V_{SS}$ through either transistors 56, 58 and 60 of column select circuit 10 or transistors 62, 64 and 66 of column select circuit 10a is equivalent to the current from $V_{DD}$ to $V_{SS}$ in the column, comprised of column load transistor 16, enabled primary column select transistor 18 or 18a, an enabled secondary column select transistor, such as 36, 38, 40 or 42, and an enabled program transistor such as transistor 28, 30, 32 or 44. The drain-to-source voltage of a chosen secondary column select transistor, such as transistor 36, can be made negligible since the gate voltage thereof attains the first supply voltage $V_{DD}$ and the geometric ratio thereof is greater than that of a program transistor. By properly sizing the geometric ratio of transistors 58 and 64, the conductivity of either of these trransistors can be made less than the conductivity of the series combination of primary column select transistors 18 or 18a and an enabled secondary column select transistor, respectively. Therefore the gate-to-source voltage of transistors 58 or 64 can be made greater than the gate-to-source voltage of transistors 18 or 18a, respectively.

Consequently, when either column select circuit 10 or 10a is enabled there will be a voltage present at the gate of either primary column select transistor 18 or 18a which is sufficient to sink all current from column load transistor 16 when a secondary column select transistor is connected to an enabled program transistor. However, the difference between the gate-to-source voltage of transistors 58 or 64 and the gate-to-source voltage of primary column select transistors 18 or 18a can be made sufficiently small to provide rapid decoupling of the column capacitance from the column load after a row precharge pulse if no program transistor is present.

Although the gate dimensions may assume several values to obtain the previously discussed ratios, in a preferred form, transistors 16, 60 and 66 have equal W/L ratios and are twice the W/L ratio of transistor 54. Similarly, program transistors 28, 30, 32 and 44 and transistors 56 and 62 have a W/L ratio about eight times greater than the W/L ratio of transistor 54. The W/L ratio of each of the transistors 68 and 72 is approximately twice the W/L ratio of each of the program transistors 28, 30, 32 and 44, whereas the W/L ratio of each of transistors 36, 38, 40, 42, 46 and 48 is approximately four times the W/L ratio of program transistors 28, 30, 32 and 44, and the W/L ratio of each of transistors 58 and 64 is approximately two times the W/L ratio of each of program transistors 28, 30, 32 and 44.

The physical dimensions of a ROM circuit depend primarily on the size of the program transistors and therefore these transistors must be of minimum size. However, speed requirements demand larger than minimum column load devices. As a result, the ratio of program transistor W/L to column load transistor W/L is reduced, thereby degrading a "low" output logic level when present. Therefore, sense amplifier 12 is coupled to the ROM output to translate the output voltage level to a more useful level. Transistors 74 and 76 form a source follower whereby transistor 76 acts as a load for transistor 74 thereby forming an intermediate output having valid logic levels. Inverter 78 forms a buffer stage for further amplifying the intermediate output voltage and providing the sense amplifier output. For example, if an invalid "low" logic level of two volts is present at the gate of transistor 74, transistor 74 will be biased on. However, transistor 76 is able to sink all the current produced by transistor 74 and therefore provide a valid logic "low" to the input of inverter 78. The output of inverter 78 is therefore a valid logic "high". Similarly, if the ROM output voltage at the gate of transistor 74 is transiently at a low "high" logic level of four volts, transistor 76 cannot sink all the current that transistor 74 is capable of sourcing and a voltage appears at the input of inverter 78 which produces a valid logic "low" at the sense amplifier output.

A disadvantage with ROM 14 is variation of the logic "low" ROM output voltage caused by variations in the conductivity ratio between transistors of different types (i.e. depletion v. enhancement). The effect of the variation is that as the conductivity of load transistor 16 increases relative to the conductivity of enhancement transistors in ROM 14, the output voltage representing a logic "low" increases. To compensate for this effect, the gate-to-source voltage of transistor 74 varies in the same manner as the ROM output voltage. That is, when the ROM logic "low" output voltage increases, the gate-to-source voltage of transistor 74 increases due to the increase of conductivity of transistor 76 relative to the conductivity of transistor 74. Therefore, the voltage at the input of buffer 78 has not increased as much as the increase in the ROM output voltage.

Conversely, when the ROM logic "low" output voltage decreases, the gate-to-source voltage of transistor 74 decreases due to the decrease of conductivity of transistor 76 relative to the conductivity of transistor 74. Therefore, the voltage at the input of buffer 78 has not decreased as much as the decrease in the ROM output voltage. One result of this compensation is improved ROM access time since the reduced variation of the sense amplifier output causes that output to be closer to the switchpoint of buffer 78. In other words, transistor 74 tracks the output of ROM 14 with respect to voltage variations arising from transistor conduction factor variations. Thus a circuit which can quickly select and decouple a predetermined column of a ROM and provide usable logic level outputs has been provided.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

I claim:

1. A read only memory column select circuit comprising:
   column load means coupled between a first supply and a ROM output;
   a primary column select transistor having a first current electrode coupled to the output terminal;
   a secondary column select transistor having a first current electrode coupled to a second current electrode of said primary column select transistor;
   a program transistor having a first current electrode coupled to a second current electrode of said secondary column select transistor, and a second current electrode coupled to a second supply;
   row select means coupled to a control electrode of said program transistor for selectively enabling said program transistor; and
   secondary column select means coupled to a control electrode of said secondary column select transistor for selectively enabling said secondary column select transistor;
   a primary column select circuit comprising:
      voltage divider means coupled between said first and second supplies and to a control electrode of said primary column select transistor, for selectively developing an enabling voltage on the control electrode of said primary column select transistor which is at least equal to, but not substantially greater than, the threshold voltage of said primary column select transistor above the voltage developed on the second current electrode of said primary column select transistor when said secondary column select and program transistors are enabled.

2. The read only memory column select circuit of claim 1
wherein said voltage divider means further comprises:
   biasing means coupled to the control electrode of said primary column select transistor for providing a predetermined current in said voltage divider means;
   a first transistor having both a first current electrode and a control electrode coupled to both the control electrode of said primary column select transistor and said biasing means, and a second current electrode;
   a second transistor having a first current electrode coupled to the second current electrode of said first transistor, a second current electrode coupled to said second supply, and a control electrode; and
   reference voltage means coupled to the control electrode of said second transistor for developing a reference voltage substantially equal to the enabling voltage developed on the control electrode of said program transistor by said row select means.

3. The read only memory column select circuit of claims 1 or 2 further comprising:

a sense amplifier having an input coupled to both the column load means and the first current electrode of said primary column select transistor, and an intermediate output for providing a voltage having a translated level.

4. The read only memory column select circuit of claim 3 wherein the sense amplifier further comprises:
a buffer output stage having an input coupled to said sense amplifier intermediate output for modifying said translated voltage level.

5. The read only memory column select circuit of claim 2 further comprising:
a sense amplifier having an input coupled to said ROM output for sensing the level of voltage at the ROM output and translating said level, comprising:
a source follower transistor having a first current electrode coupled to said first supply, a control electrode coupled to said ROM output, and a second current electrode coupled to an intermediate output; and
biasing means coupled to the second current electrode of said source follower transistor for providing a load to said source follower transistor.

6. The read only memory column select circuit of claim 5 wherein said sense amplifier further comprises:
a buffer output stage having an input coupled to said intermediate output for modifying said translated voltage level.

7. The read only memory column select circuit of claim 6 wherein said buffer output stage comprises an inverter.

8. A read only memory column select circuit and sense amplifier comprising:
column load means coupled between a first supply and a ROM output;
a primary column select MOS transistor having the drain thereof coupled to the ROM output;
a secondary column select MOS transistor having the drain thereof coupled to the source of said primary column select transistor;
a program MOS transistor having the drain thereof coupled to the source of said secondary column select transistor, and the source thereof coupled to a second supply;
row select means coupled to the gate of said program transistor for selectively enabling said program transistor; and
secondary column select means coupled to the gate of said secondary column select MOS transistor for selectively enabling said secondary column select MOS transistor;
a sense amplifier having an input coupled to said ROM output for sensing the level of voltage at the ROM output and translating said level, comprising:
a source follower transistor having the drain thereof coupled to said first supply, the gate thereof coupled to said ROM output, and the source thereof coupled to an intermediate output of said sense amplifier; and
biasing means coupled to the second current electrode of said source follower transistor for providing a load to said source follower transistor.

9. The read only memory column select circuit and sense amplifier of claim 8 wherein said sense amplifier further comprises:
a buffer output stage having an input coupled to said intermediate output for modifying said translated voltage level.

10. A read only memory column select circuit comprising:
column load means coupled between a first supply and a ROM output;
a primary column select MOS transistor having the drain thereof coupled to the ROM output;
a secondary column select MOS transistor having the drain thereof coupled to the source of said primary column select transistor;
a program MOS transistor having the drain thereof coupled to the source of said secondary column select transistor, and the source thereof coupled to a second supply;
row select means coupled to the gate of said program transistor for selectively enabling said program transistor; and
secondary column select means coupled to the gate of said secondary column select transistor for selectively enabling said secondary column select transistor;
a primary column select circuit comprising:
voltage divider means coupled between said first and second supplies and to the gate of said primary column select transistor, for selectively developing an enabling voltage on the gate of said primary column select transistor which is at least equal to, but not substantially greater than, the threshold voltage of said primary column select transistor above the voltage developed on the source of said primary column select transistor when said secondary column select and program transistors are enabled.

11. The read only memory column select circuit of claim 10 wherein said voltage divider means further comprises:
biasing means coupled to the gate of said primary column select MOS transistor for providing a predetermined current in said voltage divider means;
a first MOS transistor having both the drain and gate thereof coupled to the gate of said primary column select MOS transistor, and a source;
a second MOS transistor having the drain thereof coupled to the source of said first MOS transistor, the source thereof coupled to said second supply, and a gate; and
reference voltage means coupled to the gate of said second MOS transistor for developing a reference voltage substantially equal to the enabling voltage developed on a control terminal of said program MOS transistor by said row select means.

12. The read only memory column select circuit of claims 10 or 11 further comprising:
a sense amplifier having an input coupled to both the column load means and the drain of said primary column select transistor, and an intermediate output for providing a voltage having a translated level.

* * * * *